Oct. 1, 1940. N. E. LINDENBLAD Re. 21,590
SHORT WAVE SIGNALING
Original Filed April 5, 1932
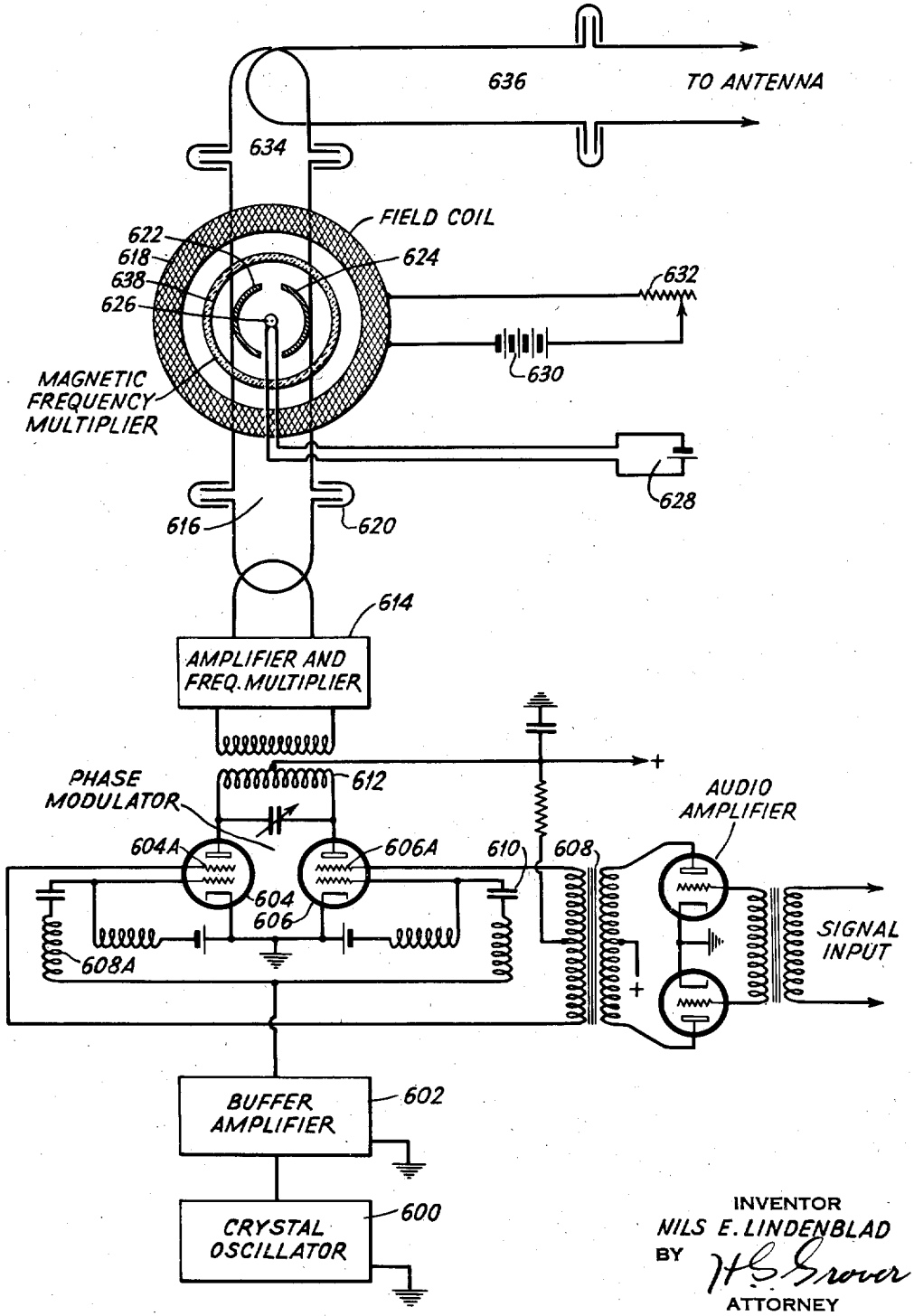
INVENTOR
NILS E. LINDENBLAD
BY H. S. Grover
ATTORNEY Reissued Oct. 1, 1940

Re. 21,590

UNITED STATES PATENT OFFICE 21,590

SHORT WAVE SIGNALING

Nils E. Lindenblad, Port Jefferson, N. Y., assignor to Radio Corporation of America, a corporation of Delaware Original No. 2,027,919, dated January 14, 1936, Serial No. 699,373, November 23, 1933, which is a division of Serial No. 603,310, April 5, 1932. Application for reissue May 25, 1940, Serial No. 337,281

7 Claims. (Cl. 250—36)

This case is a division of my copending application Serial Number 603,310, filed April 5, 1932, and relates to a system for producing ultra short waves by frequency multiplication.

Among the objects of my present invention are to provide a frequency multiplier in which like electrodes of a multi-electrode device are both subjected to fundamental frequency input voltages and simultaneously supply harmonically related output currents; and, to improve the action of such a multiplier by means of a suitable magnetic field.

My frequency multiplication action may be carried into effect by the use of a tube having a cylindrical split anode, and a linear filament arranged coaxially with the split anode, the split anode being in the form of two troughs completely insulated from each other arranged on either side of the linear filament. Fundamental input potentials may be applied to the two halves of the anodes through a simple linear conductor tunable circuit such as described in my copending application, and, at suitable points along the conductors, a suitable harmonically tuned circuit may be connected or coupled thereto. Application of the magnetic field in a direction coaxial with the linear dimension of the filament will, of course, give the harmonic output in the harmonically related circuit. Preferably, in such an arrangement, two linear tuned circuits should be used. Each of the open ends of one of the circuits should be connected to different ones of the anode sections as should also be connected the open ends of the conductors of the other circuit. One of these circuits may then be adjusted to apply fundamental frequency energy to the anode sections and the other circuit may be adjusted to have harmonic waves set up therein. In other words, such a system will make use of a common linear filament or cathode, the heating leads for which may be drawn out through the slits between the anode sections and through the side of the tube at a position intermediate the length of the anode.

Such a frequency multiplying system forming part of a phase modulation transmitter is illustrated in the accompanying drawing.

Turning to it, oscillations from a crystal controlled oscillator 600 are amplified by means of a buffer amplifier 602 in turn supplying energy to the phase modulator tubes 604, 606, through the inductive reactance 608A and capacitive reactance 610, respectively. Signal frequency energy is applied to the screen grids 604A and 606A of the tubes 604, 606 in phase opposition through the intermediary of transformer 608 as a result of which, the tubes 604, 606 become alternately more conductive. In this manner, there appears in the common output circuit 612 constant frequency energy but shifted in phase in accordance with the signal or audio frequency input applied to the screen grids of the tubes 604, 606.

The output of circuits 612 is fed to succeeding amplifiers and frequency multipliers 614, the frequency multiplication action of which serves to augment the phase shift caused by the modulation. When the output of the frequency multiplier and amplifier 614 is of desired value, it is applied to the tuned fundamental frequency input circuit 616 of the magnetic frequency multiplier 618. Tuning of the fundamental frequency circuit 616 is accomplished by preferably the use of adjustable trombone slide 620. The conductors of the circuit 616 are connected to the split anodes 622, 624, insulated from each other and arranged concentrically about a coaxial linear filament or cathode 626 supplied with energy from a heating source 628. The cathode 626 may be ground, or insulated from ground for extremely high frequencies by means of radio frequency chokes inserted in the heating leads from source 628. Magnetic field applied by the field coil of the magnetic frequency multiplier is applied coaxial with the linear filament 626 and causes action described more fully in my copending parent application. Briefly, the magnetic field causes a decided increase in the harmonic output, and, in some instances causes output where, without the field, no output would follow.

The field coil produces a magnetic field in accordance with the current from source 630 regulated by variable resistor 632. The output circuit 634 of the magnetic frequency multiplier is tuned to a harmonic frequency and also is connected as illustrated to the split anodes. Frequency multiplied energy may then be taken inductively from the output circuit 634 to the adjustable transmission line 636 and fed to a suitable radiating antenna not shown.

The split anodes may be made of carbon or any suitable metal and they, together with the filament, are hermetically sealed within the magnetic frequency multiplier container 638.

Having thus described my invention, what I claim is:

1. A frequency multiplier comprising a multi-electrode device having a cathode and a plurality of anodes the active surfaces of which are equidistantly disposed around said cathode, a tuned circuit tuned to a fundamental frequency connected between said anodes, a tuned circuit tuned to a harmonically related frequency also connected between said anodes, means for supplying energy of fundamental frequency to said circuit tuned to said fundamental frequency, and an output circuit coupled to said tuned circuit tuned to a harmonically related frequency.

2. Apparatus as claimed in claim 1 having in addition means for applying a magnetic field to the electrons flowing from said cathode to said anodes.

3. A high frequency circuit comprising a multi-electrode device having a cathode and a plurality of anodes the active surfaces of which are equidistantly located around said cathode, a circuit tuned to a fundamental frequency connected between said anodes, another circuit tuned to a harmonically related frequency connected between the identical anodes, and means for deriving from one of said circuits output energy of a frequency to which said circuit is tuned when input energy of a frequency harmonically related thereto is impressed upon the other of said circuits.

4. Apparatus as claimed in claim 3 wherein in addition means are provided for subjecting electrons flowing from said cathode to said anodes to a magnetic field.

5. A frequency multiplier comprising a multi-electrode device having a cathode and a plurality of similar cold electrodes symmetrically disposed with respect to said cathode, a tuned circuit tuned to a fundamental frequency connected between said cold electrodes, another tuned circuit tuned to a harmonically related frequency also connected between said cold electrodes, and means for supplying energy of fundamental frequency to said circuit tuned to a fundamental frequency.

6. Apparatus as claimed in the preceding claim characterized by the fact that said circuits consist substantially only of conductors having uniformly distributed inductance and capacity.

7. Apparatus as claimed in claim 5 characterized by the fact that means are provided for subjecting electrodes flowing from said cathode to said cold electrons to a magnetic field.

NILS E. LINDENBLAD.